US012696685B2

(12) United States Patent
Veches

(10) Patent No.: US 12,696,685 B2
(45) Date of Patent: Jul. 28, 2026

(54) POWER REGENERATION IN A MEMORY DEVICE

(71) Applicant: Micron Technology, Inc., Boise, ID (US)

(72) Inventor: Anthony D Veches, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/917,686

(22) Filed: Oct. 16, 2024

(65) Prior Publication Data

US 2025/0040439 A1     Jan. 30, 2025

Related U.S. Application Data

(62) Division of application No. 17/875,802, filed on Jul. 28, 2022, now Pat. No. 12,156,472.

(Continued)

(51) Int. Cl.
*H10N 19/00*     (2026.01)
*H10N 10/01*     (2023.01)
*H10N 10/17*     (2023.01)
*H10W 40/28*     (2026.01)
*H10D 48/32*     (2025.01)
(Continued)

(52) U.S. Cl.
CPC ............. *H10N 19/00* (2023.02); *H10N 10/01* (2023.02); *H10N 10/17* (2023.02); *H10W 40/28* (2026.01); *H10D 48/366* (2025.01); *H10N 10/13* (2023.02); *H10W 42/405* (2026.01)

(58) Field of Classification Search
CPC ........ H10N 19/00; H10N 10/01; H10N 10/17; H10N 10/13; H01L 23/38; H01L 23/576; H01L 29/685
See application file for complete search history.

(56) References Cited

U.S. PATENT DOCUMENTS 6,711,904 B1     3/2004  Law et al.
10,283,493 B1    5/2019  Nishida
(Continued)

FOREIGN PATENT DOCUMENTS

CN     103247337 A     8/2013
CN     105988734 A     10/2016
CN     115762587 A     3/2023

OTHER PUBLICATIONS

"Chinese Application Serial No. 202211020925.3, Office Action mailed Jul. 22, 2025", w/English Translation, 26 pgs.
(Continued)

*Primary Examiner* — Michael Y Sun
(74) *Attorney, Agent, or Firm* — Schwegman Lundberg & Woessner, P.A.

(57)     ABSTRACT

A memory device comprises multiple memory dice arranged vertically in a stack of memory dice and at least one thermoelectric die contacting the bulk silicon layer of at least one of the memory dice of the multiple memory dice. Each memory die of the multiple memory dice includes an active circuitry layer that includes memory cells of a memory array and a bulk silicon layer. The thermoelectric die is configured to one or both of reduce heat from the memory die when a current is applied to terminals of the thermoelectric die and generate a voltage at the terminals of the thermoelectric die when heat from the memory die is applied to the thermoelectric die.

11 Claims, 11 Drawing Sheets

Related U.S. Application Data

(60) Provisional application No. 63/240,001, filed on Sep. 2, 2021.

(51) Int. Cl.
*H10N 10/13*      (2023.01)
*H10W 42/40*      (2026.01)

(56) References Cited

U.S. PATENT DOCUMENTS

| | | | |
|---|---|---|---|
| 11,444,001 B1 * | 9/2022 | Du | H01L 25/50 |
| 2015/0089961 A1 | 4/2015 | Duzly et al. | |
| 2015/0094875 A1 * | 4/2015 | Duzly | G06F 13/1668 |
| | | | 700/300 |
| 2016/0027717 A1 | 1/2016 | Jang et al. | |
| 2016/0284798 A1 * | 9/2016 | Yoshida | H10D 62/115 |
| 2020/0083157 A1 * | 3/2020 | Goh | H01L 24/02 |
| 2020/0105639 A1 * | 4/2020 | Valavala | H10N 10/17 |
| 2023/0051881 A1 * | 2/2023 | Hsieh | H01L 23/38 |
| 2023/0065314 A1 | 3/2023 | Veches | |

OTHER PUBLICATIONS

"Chinese Application Serial No. 202211020925.3, Decision of Rejection mailed Jan. 20, 2026", with manual English translation, 29 pages.

"Chinese Application Serial No. 202211020925.3, Response filed Nov. 24, 2025 to Office Action mailed Jul. 22, 2025", with English claims, 21 pages.

\* cited by examiner

_Fig. 2_
200
MEMORY DEVICE
110
CONTROLLER
220
RANDOM ACCESS MEMORY
PROCESSING CIRCUITRY
230
PROCESSOR(S)
PR
PR
HOST INTERFACE
MEMORY DIE INTERFACE
240
MEMORY DIE
MEMORY DIE
MEMORY DIE
MEMORY DIE
225
HOST
105
115

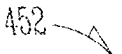
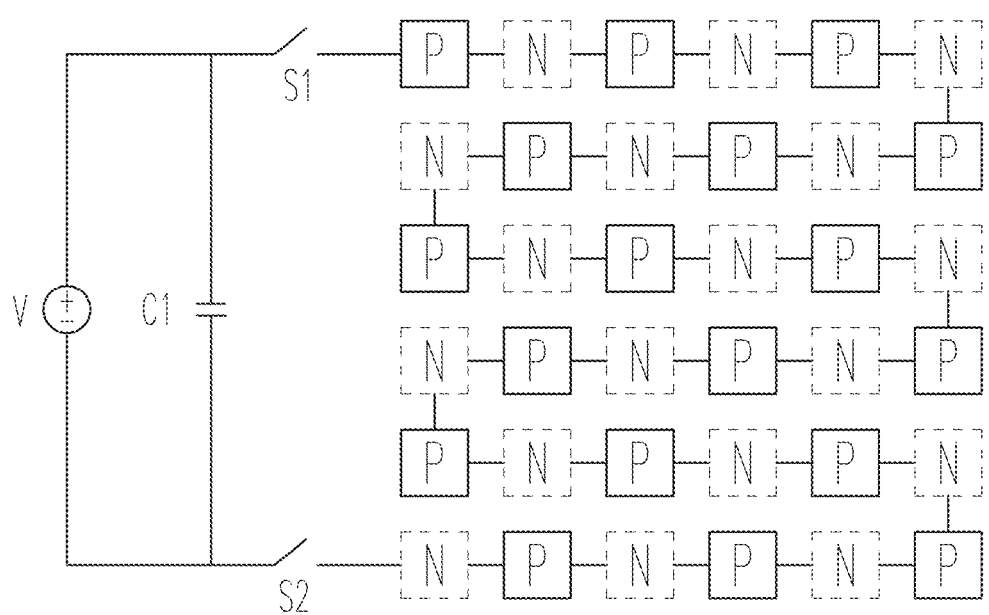
*Fig. 4A*
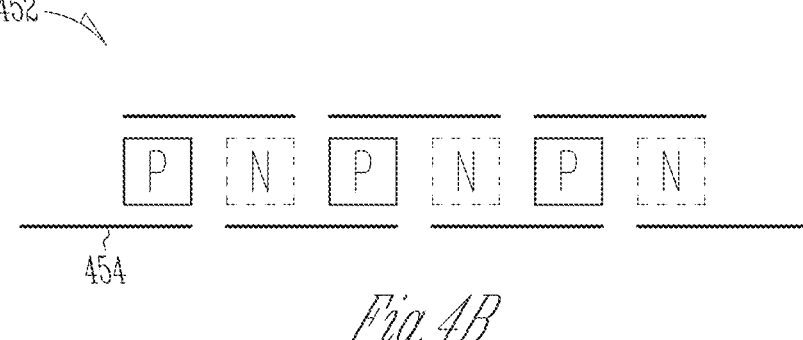
*Fig. 4B*

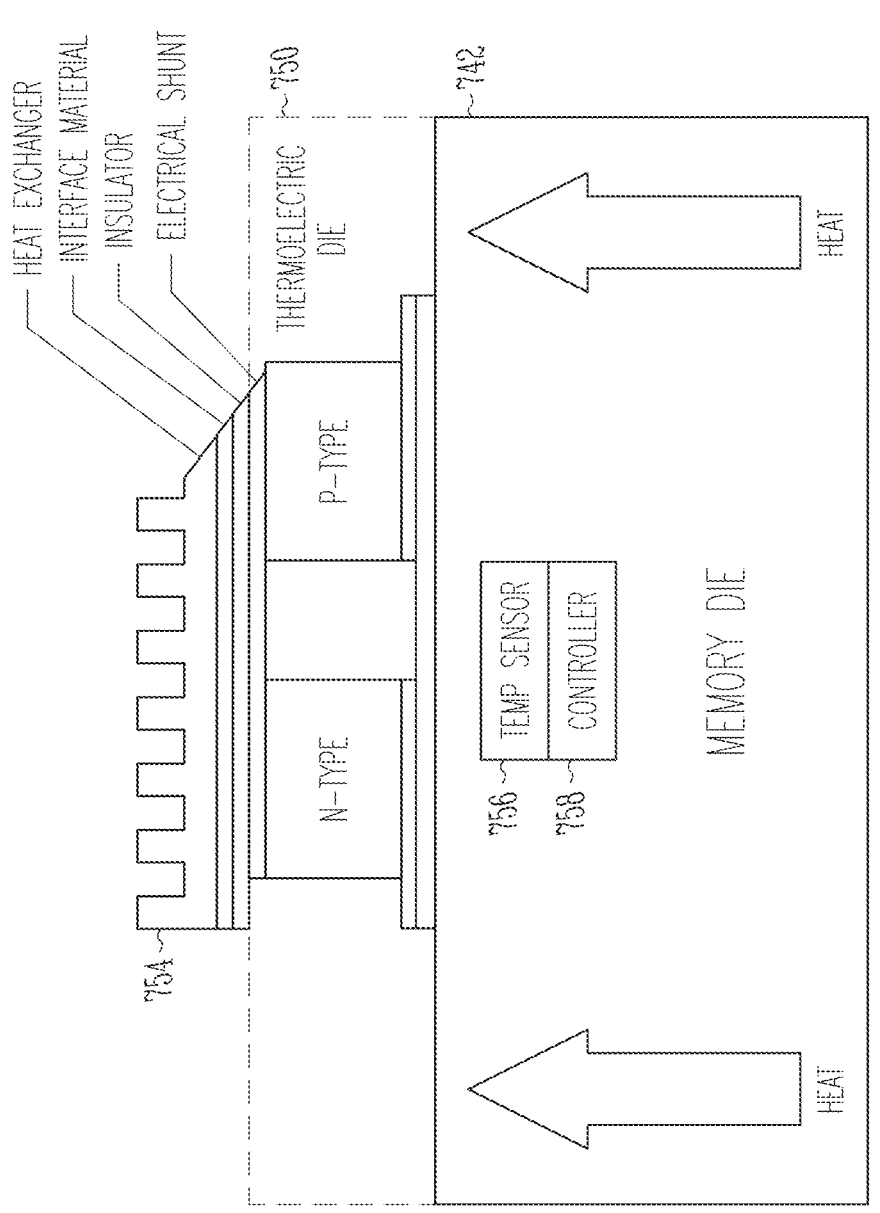
HEAT EXCHANGER
INTERFACE MATERIAL
INSULATOR
ELECTRICAL SHUNT
THERMOELECTRIC DIE
N-TYPE    P-TYPE
TEMP SENSOR
CONTROLLER
MEMORY DIE
HEAT    HEAT
_Fig. 7_

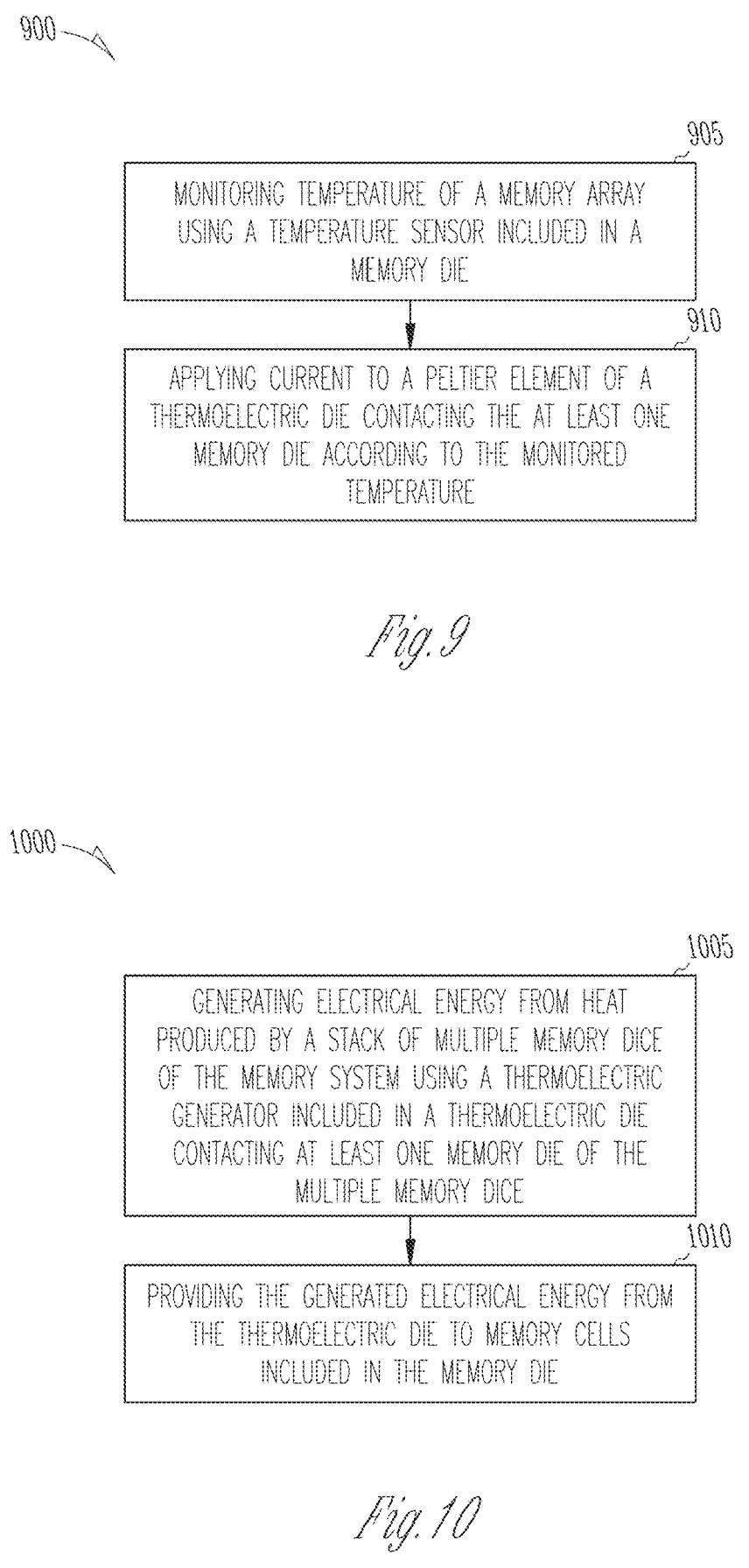

900 —

905

MONITORING TEMPERATURE OF A MEMORY ARRAY
USING A TEMPERATURE SENSOR INCLUDED IN A
MEMORY DIE

910

APPLYING CURRENT TO A PELTIER ELEMENT OF A
THERMOELECTRIC DIE CONTACTING THE AT LEAST ONE
MEMORY DIE ACCORDING TO THE MONITORED
TEMPERATURE

GENERATING ELECTRICAL ENERGY FROM HEAT
PRODUCED BY A STACK OF MULTIPLE MEMORY DICE
OF THE MEMORY SYSTEM USING A THERMOELECTRIC
GENERATOR INCLUDED IN A THERMOELECTRIC DIE
CONTACTING AT LEAST ONE MEMORY DIE OF THE
MULTIPLE MEMORY DICE

1010

PROVIDING THE GENERATED ELECTRICAL ENERGY FROM
THE THERMOELECTRIC DIE TO MEMORY CELLS
INCLUDED IN THE MEMORY DIE

*Fig. 10*

POWER REGENERATION IN A MEMORY DEVICE

PRIORITY APPLICATION

This is a divisional application which claims priority to U.S. application Ser. No. 17/875,802, filed Jul. 28, 2022, which claims the priority benefit of U.S. Provisional Application Ser. No. 63/240,001, filed Sep. 2, 2021, all of which are incorporated by reference in their entirety.

TECHNICAL FIELD

Embodiments of the disclosure relate to memory devices, and more specifically relate to augmenting electrical energy used to operate memory arrays of the memory devices with electrical energy generated from heat from the memory devices.

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc., as discussed further below.

A challenge in memory devices is reducing the power used to operate the memory devices. Reducing the power of memory devices improves overall performance of the electronic system by improving battery life and reducing system power bussing. Being able to manage the power used in memory devices also allows for thermal management of the electronic system.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 2 is a block diagram of another example system including a host device and a memory device according to some examples described herein.

FIGS. 4A-4B are diagrams illustrating an example of a thermoelectric generator according to some examples described herein.

FIG. 5-8 illustrate further examples of portions of a memory device according to some examples described herein.

FIGS. 9-10 are flow diagrams of example methods of operating a memory device according to some examples described herein.

DETAILED DESCRIPTION

Figure 1:
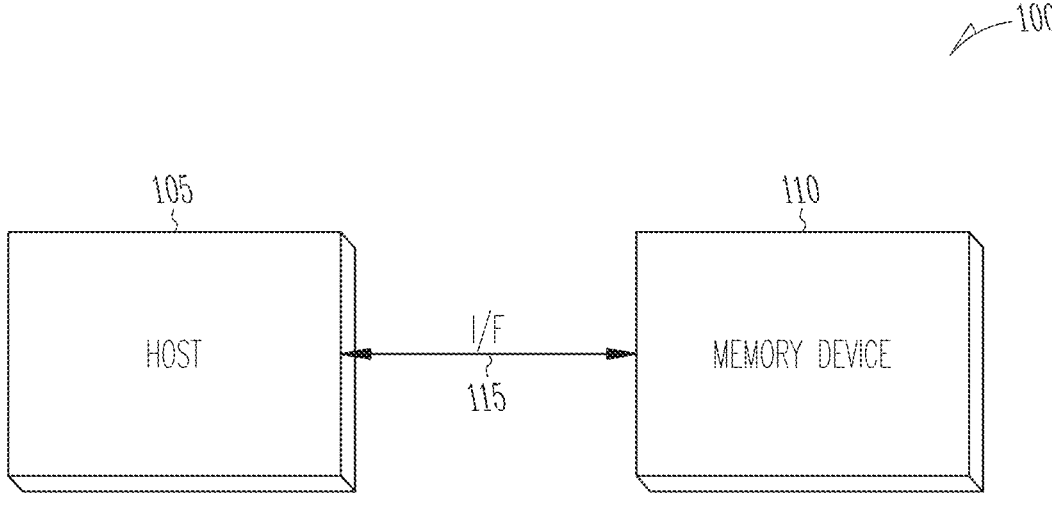
FIG. 1 is an illustration of an example system including a host device and a memory device according to some examples described herein.

Memory devices can include arrays of memory cells. Managed memory devices can include a memory controller to control or manage access to memory arrays typically formed of multiple individual memory die, and to operate the memory device according to memory management protocols as may be established, in some examples in accordance with an established industry standard operation. It is desirable to reduce the power needed to operate memory devices to improve system performance. Operating power for a memory device can be reduced through recovery of the energy expended to operate the memory device.

Memory devices generate heat through their operation. An approach to recover the energy expended is to convert thermal energy generated from operating the device back into electrical energy that can be used to operate the memory device. A thermoelectric generator converts thermal energy into electrical energy. Using a thermoelectric device in conjunction with the memory device may generate electrical energy that can be used to augment the power supplied to the memory device.

Memory devices include individual memory die, which may, for example, include a storage region comprising one or more arrays of memory cells, implementing one (or more) selected storage technologies. Such memory die will often include support circuitry for operating the memory array(s). Other examples, sometimes known generally as "managed memory devices," include assemblies of one or more memory die associated with controller functionality configured to control operation of the one or more memory die. Such controller functionality can simplify interoperability with an external device, as a "host" device as discussed later herein. In such managed memory devices, the controller functionality may be implemented on one or more die also incorporating a memory array, or on a separate die. In other examples, one or more memory devices may be combined with controller functionality to form a solid-stage drive (SSD) storage volume.

Embodiments of the present disclosure are described in the example of managed memory devices implementing NAND flash memory cells. These examples, however, are not limiting on the scope of the disclosure, which may be implemented in other forms of memory devices and/or with other forms of storage technology.

Both NOR and NAND flash architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell(s) that can store more than one bit of data per cell (i.e., that can represent more than two programmed states).

Managed memory devices may be configured and operated in accordance with recognized industry standards. For example, managed NAND devices may be (as non-limiting examples), a Universal Flash Storage (UFS™) device, an embedded MMC device (eMMC™), etc. For example, in the case of the above examples, UFS devices may be configured in accordance with Joint Electron Device Engineering Council (JEDEC) standards (e.g., JEDEC standard JESD223D, entitled "JEDEC UFS Flash Storage 3.0," and/or updates or subsequent versions to such standard). Similarly, identified eMMC devices may be configured in accordance with JEDEC standard JESD84-A51, entitled "JEDEC eMMC standard 5.1," and/or updates or subsequent versions to such standard. The identified standards are provided only as example environments in which the described methods and structures may be utilized, but such methods and structures may be utilized in a variety of environments outside of the identified standards (or of any other actual or proposed standards), except as expressly indicated herein.

An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact. Managed memory devices, for example managed NAND devices, can be used as primary or ancillary memory in various forms of electronic devices, and are commonly used in mobile devices.

Both SSDs and managed memory devices can include a number of memory devices, including a number of dies or logical units (e.g., logical unit numbers or LUNs), and can include one or more processors or other controllers performing logic functions required to operate the memory devices or interface with external systems. Such SSDs and managed memory devices can include one or more flash memory die, including a number of memory arrays and peripheral circuitry thereon.

In various forms of memory devices having multiple memory die, assembling the die in one or more vertical stacks is often a desirable configuration, as it typically provides a physically compact structure, occupying a relatively reduced footprint on a supporting structure (PC board, substrate, etc.). A resulting problem, however, is that heat can build up within the vertical stacks, as heat may have to travel through a lateral or vertical portion of the vertical stack to dissipate to the surrounding environment. Not only can this heat be detrimental to long-term functioning of the individual memory die; but it can also lead to short-term variations in functionality. For example, either flash or DRAM memory cells can exhibit different retention characteristics at elevated temperatures, relative to the characteristics at lower temperatures. Additionally, under some operating conditions, for example where one or more memory die in a stack are subject to increased memory operations, localized heating may result in the one or more die, or in just portions thereof.

Additionally, in some cases different operating parameters for the memory die may be required to maintain adequate functionality at elevated temperature. For example, in flash memory different voltages may be required during read and/or write operations. Similarly, refresh rates may need to be increased for DRAM cells operating at elevated temperatures. Additionally, power efficiency is commonly a consideration in operating memory structures, though the implications of power efficiency may be most severely felt in mobile operations where power is obtained from a from a battery. As a result, memory devices, particularly those with stacked memory die, tend to accumulate heat which can be problematic. Accordingly, improved operation may be achieved for various types of systems, by a memory device that can make use of accumulated heat for example to recover energy from the heat to operate the memory device. In some systems, other advantages would be obtained by structures to remove heat, potentially including localized heat, in the memory stack to improve system functionality and stability.

FIG. 1 is an illustration of an example system 100 including a host 105 and a memory device 110. The host 105 can include a host processor, a central processing unit, or one or more other device, processor, or controller. The memory device 110 can include one or more other memory devices, or the communication interface 115 can include one or more other interfaces, depending on the host 105 and the memory device 110.

Each of the host 105 and the memory device 110 can include a number of receiver or driver circuits configured to send or receive signals over the communication interface 115, or interface circuits, such as data control units, sampling circuits, or other *intermedia* circuits configured to process data to be communicated over, or otherwise process data received from the communication interface 115 for use by the host 105, the memory device 110, or one or more other circuits or devices.

The memory device 110 can include a memory array (e.g., one or more arrays of memory cells included in memory die, such as a NAND flash memory array, or one or more other memory arrays), a memory controller, and in certain examples, an interface circuit between the memory array and the memory controller. In certain examples, the memory device can include a number of memory die, each having control logic separate from the memory controller. The memory controller can include an application specific integrated circuit (ASIC), a field programmable gate array (FPGA), or one or more other processing circuits arranged or programmed to manage data transfers or operations to, from, or within the memory array.

FIG. 2 is a block diagram of an example of a system 200 including a host device 105 and a memory device 110 configured to communicate over a communication interface 115. The host device 105 or the memory device 110 may be included in a variety of products, such as Internet of Things (IoT) devices (e.g., a refrigerator or other appliance, sensor, motor or actuator, mobile communication device, automobile, drone, etc.) to support processing, communications, or control of the product.

The memory device 110 includes a memory controller 220 and memory dice 225 that each include memory cells of the memory array of the memory device. The memory dice include a number of individual memory die (e.g., a stack of 3D NAND die) that each include a portion of the memory array.

In an example, the memory device 110 may be a discrete memory or storage device component of the host device 105. In other examples, the memory device 110 may be a portion of an integrated circuit (e.g., system on a chip (SOC), etc.), stacked or otherwise included with one or more other components of the host device 105. In these examples, the memory device 110 communicates with host device 105 components via communication interface 115. Thus, as described herein, a host, or host device 105 operation is distinct from those of the memory device 110, even when the memory device 110 is integrated into the host device 105.

Various forms of communication interfaces may be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 may include a host system, an electronic device, a processor, a memory card reader, or one or more other electronic devices external to the memory device 110. In some examples, the host 105 may be a machine having some portion, or all, of the components discussed in reference to the machine 1000 of FIG. 10.

The memory controller 220 may receive instructions from the host 105, and may communicate with the memory array, such as to transfer data to (e.g., write) or from (e.g., read), or to erase one or more of the memory cells, planes, sub-blocks, blocks, or pages of the memory array. For example, the memory controller 220 includes processing circuitry 230, which may include one or more processors which, when present, operate to execute instructions stored in the memory device 110. For purposes of the present examples, the instructions will be discussed as firmware, though instructions may also be present as software; and all or some portion of the described functions may also be implemented in circuitry including one or more components or integrated circuits.

For example, the memory controller 220 may include one or more memory control units, circuits, or components configured to control access across the memory array and to provide a translation layer between the host 105 and the memory device 110. Additionally, the memory controller 220 may include a memory die interface 240 to interface with the associated memory array. In some examples implementing a flash memory system, the memory die interface 240 may an Open NAND Flash Interface (ONFI). Although the memory controller 220 is here illustrated as part of the memory device 110 package, other configurations may be employed, such as the memory controller 220 being a component of the host 105 (e.g., as a discrete package on a system-on-a-chip of the host 105 that is separate from the memory service 110), or even implemented via a central processing unit (CPU) of the host 105.

Memory device 110 can receive a supply voltage, including supply voltages Vcc and Vss. Supply voltage Vss can operate at a ground potential (e.g., having a value of approximately zero volts). Supply voltage Vcc can include an external voltage supplied to memory device 110 from an external power source such as a battery or alternating current to direct current (AC-DC) converter circuitry. The memory controller 220 may include power management circuitry which may include at least a portion of the processing circuitry 230, and which, in selected implementations may include additional hardware circuitry configured to perform the thermal management functions as described herein.

Memory dice 225 can include non-volatile memory, such that memory cells of the memory dice can retain information stored thereon when power (e.g., voltage Vcc, Vss, or both) is disconnected from memory device 110. For example, memory device 110 can be a flash memory device, such as a NAND flash (e.g., 3-dimensional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 110 may include other components not shown in FIG. 2 so as not to obscure the example embodiments described herein.

As explained previously herein, using a thermoelectric device in conjunction with the memory device 110 may generate electrical energy that can be used to augment the power supplied to the memory device 110. The power draw of memory varies with the amount of activity to the memory. For high volume accesses, the temperature of memory dice can reach 100 degrees Celsius (100° C.). The thermoelectric generator may use the Seebeck effect to passively convert thermal energy into electrical energy. The Seebeck effect is an electromotive force that causes a potential difference to develop in an electrically conductive material when there is a temperature difference or temperature gradient across the material. Converting thermal energy into electrical energy can both reduce the heat load on the memory device 110 and recover electrical energy to power the memory array, which lowers the energy demand of the memory device 110.

Figure 3:
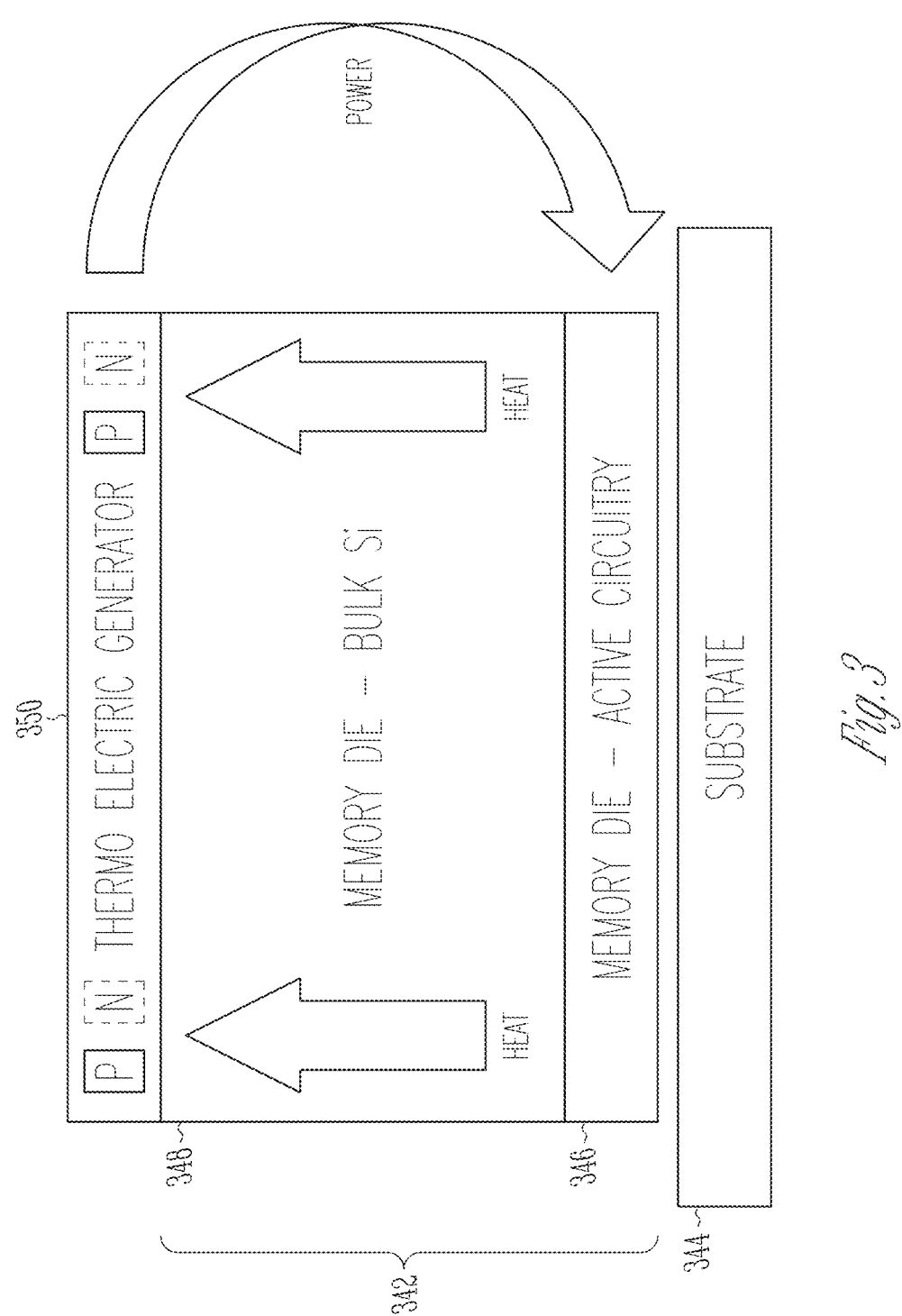
FIG. 3 is an example of portions of a memory device according to some examples described herein.

FIG. 3 is a functional representation of an example of portions of a memory device, such as memory device 110 of FIG. 2. The example of FIG. 3 includes a memory die 342 and a package substrate 344. The memory die 342 may be included in a stack of memory dice of the memory device (e.g., memory dice 225 of the memory 110 device of FIG. 2). The memory die 342 includes an active circuitry layer 346 and a bulk silicon layer 348 (this functional representation is not meant to depict relative thicknesses of the layers). The active circuitry layer 346 includes memory cells of the memory die 342 and the memory interface logic of the memory die 342.

The memory device also includes a thermoelectric die 350 contacting the bulk silicon layer 348 of the memory die 342. The thermoelectric die 350 generates a voltage at the terminals of the thermoelectric die when heat from the memory die 342 is applied to the thermoelectric die. The thermoelectric die 350 may include a thermoelectric generator that produces electrical energy using the heat from the memory die 342. The electrical energy produced is used to at least partially power the memory cells of the memory die 342. In some examples, the thermoelectric die 350 includes an energy storage device to store the electrical energy, and the stored electrical energy is provided to the memory die 342. An example of the energy storage device is a capacitor.

FIGS. 4A and 4B illustrate an example of a thermoelectric generator 452. The thermoelectric generator 452 may contact a memory die (not shown) and produce electrical energy using the heat from the memory die. The thermoelectric generator includes multiple alternating regions of p-type conductivity (P) and n-type conductivity (N) connected in series as a string of p-n regions. FIG. 4B shows a string of alternating p-n regions connected in a daisy chain fashion with the lines 454 representing an electrical connection between p-n regions. FIG. 4A shows that the p-n regions can be arranged in a matrix or array of p-n regions. The matrix may include many p-n regions connected in a daisy-chain fashion (e.g., 20-100 p-n junctions). As an example, the matrix TEG may be 2 to 5 millimeters (2-5 mm) on a side.

The ends of the daisy-chained connected junctions are connected to capacitor C1 through switches S1 and S2. Capacitor C1 may be a circuit element of the thermoelectric generator, or C1 may represent a capacitance of the power network connected to the thermoelectric generator. The energy stored in capacitor C1 can be provided in parallel with energy from a circuit supply V to the memory array or another portion of the memory device. In another example, the capacitor C1 is a supercapacitor. A supercapacitor, sometimes called an ultracapacitor, includes a different dielectric material than a conventional capacitor (e.g., a non-solid dielectric material) and have an energy density much greater than the energy density of electrolytic capacitors. Some examples of supercapacitors include double-layer capacitors, pseudo-capacitors, and hybrid capacitors.

Returning to FIG. 3, the thermoelectric die 350 can be formed on a separate wafer from the memory die 342. One or both of the separate wafers may be ground to a desired height or thickness. The thermoelectric die 350 is then bonded to the memory die 342 before or after the wafers are diced. The thermoelectric generator may be bonded the active circuitry layer 346 of the memory die 342 using wire bonds and the electrical energy is provided to the memory die 342 using one or more of the wire bonds. In some examples, the thermoelectric generator contacts the active circuitry layer 346 using through silicon vias (TSVs) that extend from the back of the memory through the bulk silicon layer 348 to the active circuitry layer 346 and the electrical energy is provided to the memory die 342 using the TSVs.

In some examples, the thermoelectric generator is fabricated on the back of the memory die 342. The wafer with the memory dice may be ground to the desired height after the memory dice are fabricated. The back of the bulk silicon layer 348 (the side opposite from the active circuitry layer 346) is patterned with thermoelectric generators. A thermoelectric generator fabricated on the back of the memory die 342 die can be connected to the active circuitry layer 346 using wire bonds or TSVs.

The memory die 342 of FIG. 3 may be one of multiple memory dice that are arranged vertically as a stack of memory dice. The stack of memory dice may include one or more thermoelectric die 350. In some examples, a thermoelectric die 350 is arranged between every two of the memory dice of the stack.

Figure 5:
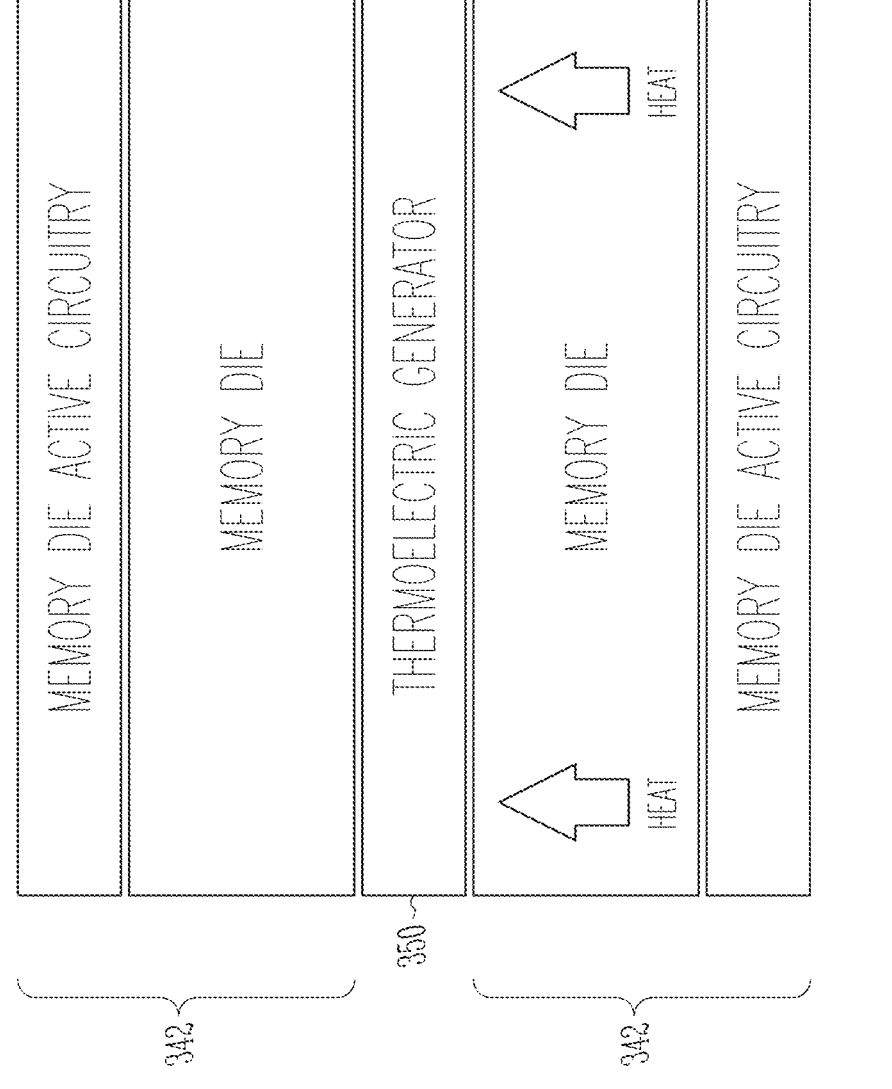

FIG. 5 is an example of a stack of memory dice 342 arranged back-to-back with a thermoelectric die 350 arranged in between them. In variations, a thermoelectric die 350 is placed in the stack above every two memory dice, or above every three memory dice, etc. Because more heat is typically generated by stacked memory dice, a thermoelectric die 350 placed in a stack of memory dice may produce more current. Because generating the electrical energy lowers the heat load of a memory dice, the number of heat sinks needed for the memory device may be reduced or the size of the heat sinks may be reduced. Thus, using the thermoelectric generators may save space in the electronic system (e.g., a server, a tablet computer, or a smartphone) that includes the memory device.

Figure 6:
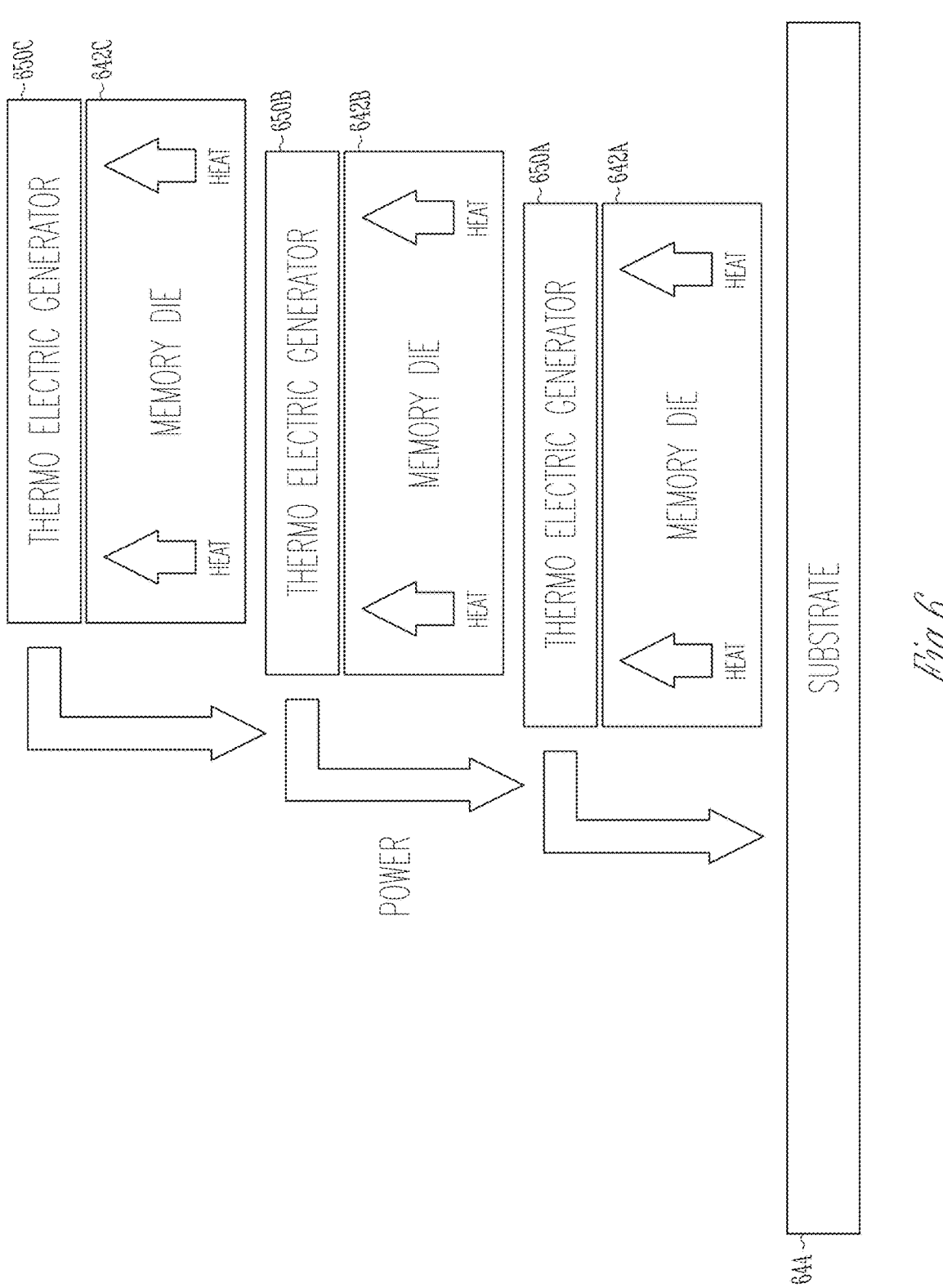

FIG. 6 is another example of portions of a memory device, such as memory device 110 of FIG. 2. The memory device includes multiple memory dice 642A, 642B, 642C arranged in a stack on a package substrate 644. The memory device also includes multiple thermoelectric dice 650A, 650B, 650C. The thermoelectric dice are arranged in pairs with the multiple memory dice (642A, 650A), (642B, 650B), (642C, 650C). The thermoelectric die of a pair contacts the bulk silicon of the memory die of the pair. The multiple pairs are arranged vertically and laterally offset from an adjacent pair to form a staircase-stack of pairs. A portion of the thermoelectric die of the pair is exposed to air. The lateral offset between die may be useful to provide wire bonding among the dice. Electrical energy from a thermoelectric generator may be used to provide power to the memory cells of the associated memory die, or electrical energy from multiple thermoelectric generators may be provided to the memory cells of one memory die.

The thermoelectric generator may use the Seebeck effect to passively convert thermal energy into electrical energy. The Seebeck effect is an electromotive force that causes a potential difference to develop in an electrically conductive material when there is a temperature difference or temperature gradient across the material.

Returning to FIG. 3, the thermoelectric die 350 contacting the bulk silicon layer 348 of the memory die 342 can include a peltier element. In the Peltier effect, running an electric current through a junction of two dissimilar conductors (e.g., a junction of a p-type conductor and an n-type conductor) can heat or cool the junction depending on the direction of current flow. The peltier element of the thermoelectric die 350 reduces heat of the memory die 342 when a current is applied to the peltier element. The series connected string of p-n regions can be used as a peltier element. Applying current through the series connected string of p-n regions using current drive circuitry can reduce heat of the memory die 342.

In some examples, the peltier element is fabricated on the back of the memory die 342. The wafer with the memory dice may be ground to the desired height after the memory dice are fabricated. The back of the bulk silicon layer 348 (the side opposite from the active circuitry layer 346) is patterned with the peltier element.

FIG. 7 is another example of portions of a memory device. The example shows a memory die 742 and a thermoelectric die 750 that includes a peltier element. The thermoelectric die 750 shows one p-n region of the series connected string of p-n regions connected by an electrical shunt. The example in FIG. 7 also shows a heat sink 754 contacting the thermoelectric die 750 with an electrically insulating layer and a layer of heat interfacing material between the thermoelectric die 750 and the heat sink 754.

The peltier element of the thermoelectric die 750 can be used to regulate the temperature of the memory die 742. The memory die 742 can include a temperature sensor 656 that produces a temperature signal representative of temperature of the memory die 642. The memory die includes a controller 758 or other logic circuitry that initiates applying the current to the peltier element according to the temperature signal, such as when the temperature signal indicates that the temperature of the memory die 742 exceeds a temperature threshold. In some examples, the temperature sensor 756 is included in the thermoelectric die 750. Current drive circuitry of the thermoelectric die 750 applies current to the peltier element to draw heat from the memory die 742 when the temperature sensor of the thermoelectric die 750 exceeds the temperature threshold. Reducing the temperature can help maintain or regulate the temperature of the memory array within a desired temperature operating range to improve lifetime of the memory array.

The memory device may include multiple memory dice arranged in pairs with thermoelectric dice in a stack as in the examples of FIG. 6. At least a portion of the peltier element of the thermoelectric die of the pair may be included in the exposed portion of the thermoelectric die of the pairs. In some examples, the heat sink 754 of FIG. 7 is placed over the exposed portion of the thermoelectric die of the pairs.

Figure 8:
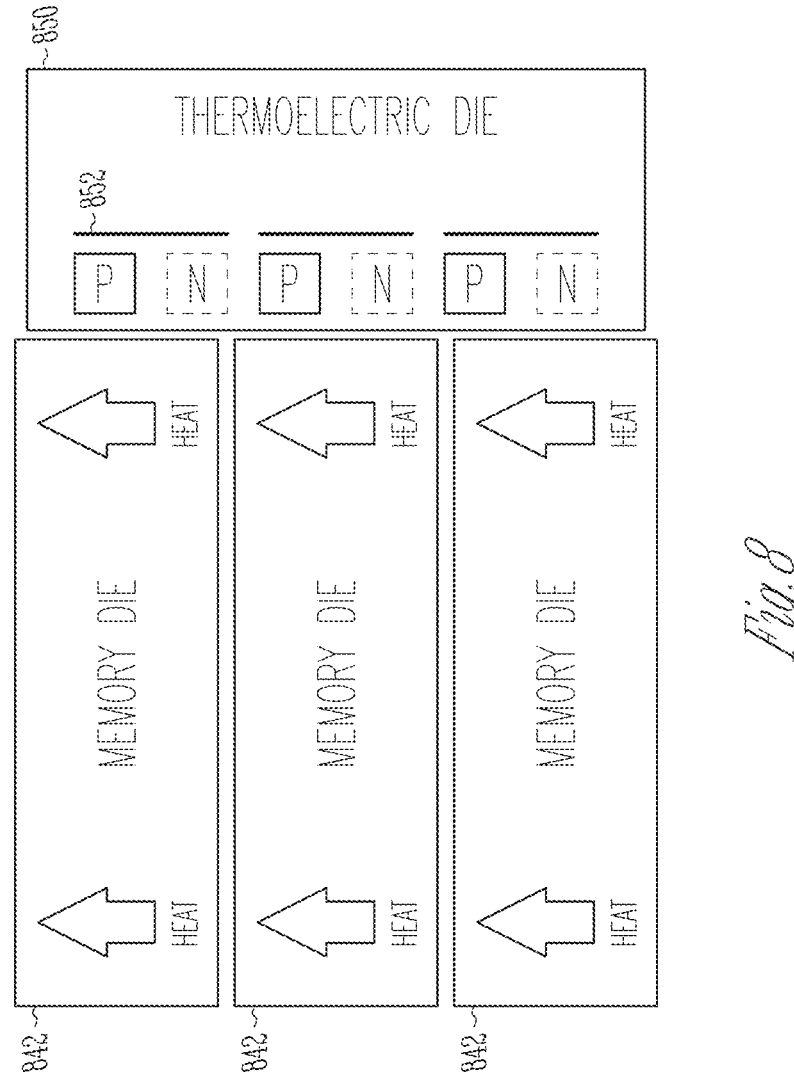

FIG. 8 is another example of portions of a memory device. Multiple memory dice 842 are arranged vertically in a stack having sidewalls. A thermoelectric die 850 having a peltier element 852 contacts a sidewall of the memory dice stack and contacts the silicon of a memory die 842 on a side of the memory die 842. The thermoelectric die may have a heat sink contacting the thermoelectric die, such as on the surface facing away from the memory dice stack. In certain examples, the memory dice stack has a thermoelectric die 850 on more than one sidewall (e.g., on each of the four sidewalls).

FIG. 9 is a flow diagram of an example of a method 900 of operating a memory system. The memory system includes a memory array that is included in multiple memory dice. The multiple memory dice may be arranged in stair-cased stack as in the example of FIG. 6. At block 905, the temperature of the memory array is monitored. At least one of the memory dice includes a temperature sensor that monitors temperature of the memory die by producing a temperature signal representative of temperature. The memory system includes at least one thermoelectric die contacting a memory die. The thermoelectric die includes a peltier element, such as a series of daisy-chain connected p-n regions as in the example of FIG. 7. In variations, the temperature sensor is included in the thermoelectric die. In certain examples, the memory system includes multiple thermoelectric dice, with a thermoelectric die contacting each of the memory die.

At bock 910, current is applied to the peltier element of the thermoelectric die based on the monitored temperature. The memory system may include a controller, and the controller initiates sending current through the peltier element when the temperature of one or more memory die exceeds a threshold temperature. Sending the current through the peltier element pull heat away from the memory die associated with the peltier element. In certain examples, the thermoelectric die includes current control circuitry to source or sink current through the peltier element. In some examples, hysteresis is used in driving current through the peltier element. A controller initially applies to the peltier element when the monitored temperature exceeds a first threshold temperature and ends the current when the monitored temperature is less than a second threshold temperature that is less than the first threshold temperature.

The series connected string of p-n regions can be used as either a peltier element to cool a memory die, or a thermoelectric generator to generate electrical energy from heat of the memory die. FIG. 10 is a flow diagram of an example of another method 1000 of operating a memory system. At block 1005, electrical energy is generated from heat produced by a stack of multiple memory dice of the memory system using a thermoelectric generator such as the series connected string of p-n regions in the example of FIGS. 4A-4B. The thermoelectric generator may be included in a thermoelectric die contacting at least one memory die of the multiple memory dice. At block 1010, the electrical energy is provided from the thermoelectric die to memory cells included in the at least one memory die. In certain examples, the thermoelectric die includes an energy storage device. The generated electrical energy is stored in the energy storage device and stored electrical energy is provided to the memory cells of the memory die from the energy storage device.

Figure 11:
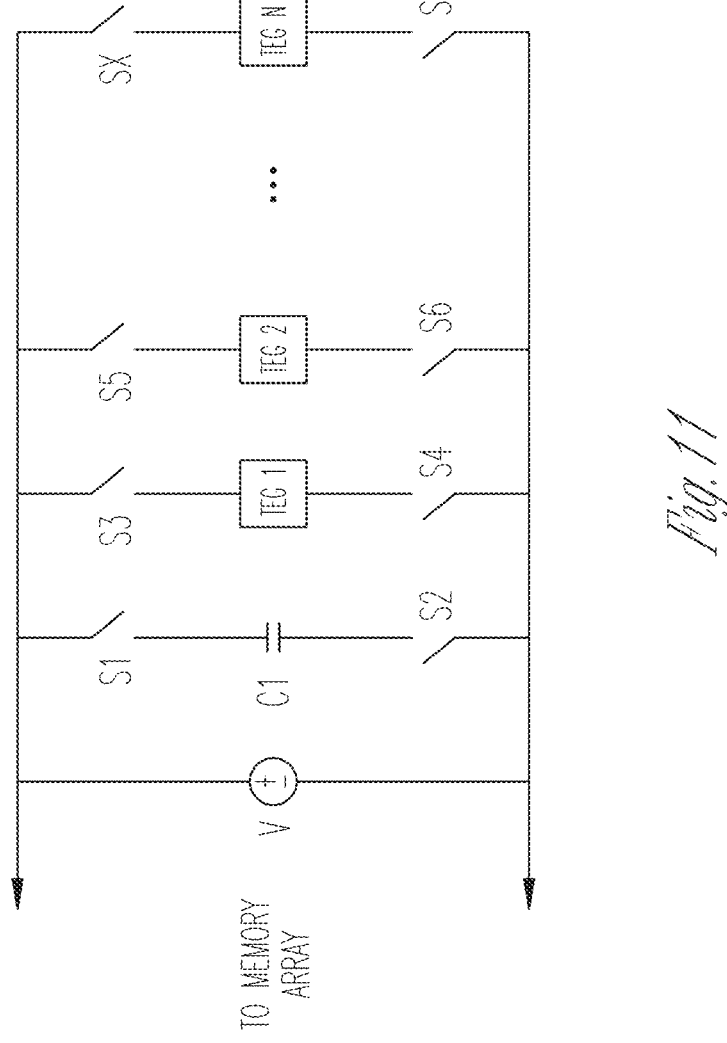
FIG. 11 is a block diagram showing multiple thermoelectric generators.

FIG. 11 is a block diagram showing multiple thermoelectric generators (TEGs) numbered TEG1, TEG2, . . . . TEGN for a memory device, such as the memory device 110 of FIG. 2. The N TEGs may contact N memory dice (not shown). The memory dice and TEGs may be arranged in a stack as in FIG. 6. The TEGs produce electrical energy from the heat generated by the memory dice. The memory controller (e.g., memory controller 220 of FIG. 2) may selectively activate switches S1 through SY to store the electrical energy from one or more TEGs on an energy storage device such as capacitor C1. Alternatively, the TEGs may be used to cool the memory dice. The memory controller 220 may disconnect capacitor C1 and selectively attach one or more of the TEGs to the circuit supply (V) to apply current to the TEGs. The memory device may include current regulating circuitry to regulate the current applied to the TEGs. A TEG may be included in a TEG die, as in FIG. 3 or FIG. 7 for example, that may include a temperature sensor. The memory controller activates switches to apply current to a TEG based on the temperature of the TEG.

The techniques described herein improve the overall performance of a memory system by reducing energy consumption of the memory system which improves battery life of the system and reduces system power bussing in the system. The techniques described herein also provide for thermal management of memory devices of the memory system.

Figure 12:
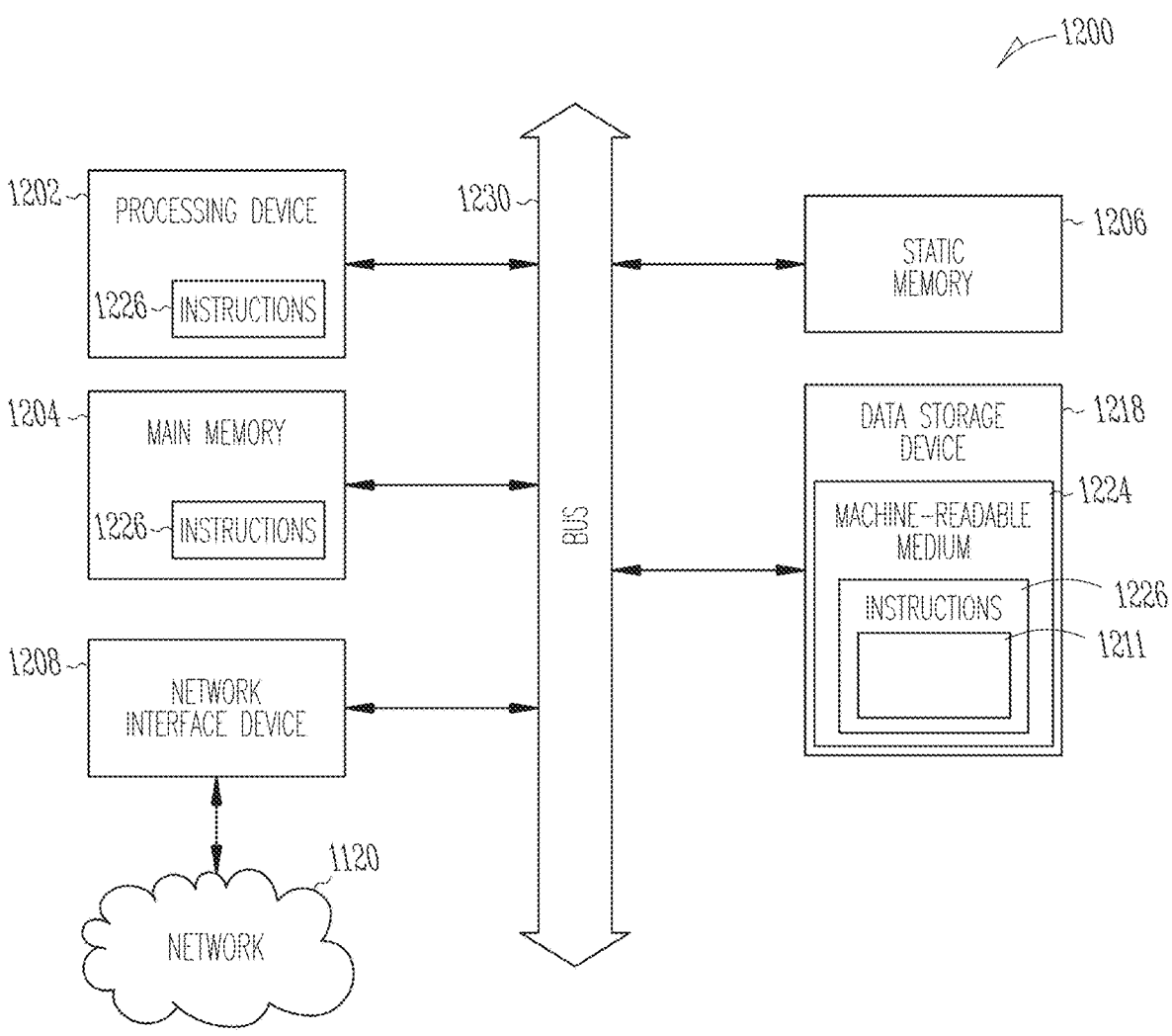
FIG. 12 illustrates a block diagram of a machine according to some examples described herein.

FIG. 12 illustrates a block diagram of an example machine 1200 upon which any one or more of the techniques (e.g., methodologies) discussed herein may perform, such as the described finer trim programming operations for extreme operating temperatures for example. In alternative examples, the machine 1200 may operate as a standalone device or may be connected (e.g., networked) to other machines. In a networked deployment, the machine 1200 may operate in the capacity of a server machine, a client machine, or both in server-client network environments. In an example, the machine 1200 may act as a peer machine in peer-to-peer (P2P) (or other distributed) network environment. The machine 1200 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (Saas), other computer cluster configurations.

The embodiments and examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1200 (e.g., the host 105, the memory device 110 of FIG. 1, etc.) may include a processing device 1202 (e.g., a hardware processor, a central processing unit (CPU), a graphics processing unit (GPU), a hardware processor core, or any combination thereof, such as a memory controller of the memory device 110, etc.), a main memory 1204 (e.g., read-only memory (ROM), flash memory, dynamic random-access memory (DRAM) such as synchronous DRAM (SDRAM) or Rambus DRAM (RDRAM), etc.), a static memory 1206 (e.g., flash memory, static random-access memory (SRAM), etc.), and a data storage system 1218, some or all of which may communicate with each other via an interlink (e.g., bus) 1230.

The processing device 1202 can represent one or more general-purpose processing devices such as a microprocessor, a central processing unit, or the like. More particularly, the processing device 1202 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1202 can also be one or more special-purpose processing devices such as an application specific integrated circuit (ASIC), a field programmable gate array (FPGA), a digital signal processor (DSP), network processor, or the like. The processing device 1202 can be configured to execute instructions 1226 for performing the operations and steps discussed herein. The machine 1200 can further include a network interface device 1208 to communicate over a network 1220.

The data storage system 1218 can include a machine-readable storage medium 1224 (also known as a computer-readable medium) on which is stored one or more sets of instructions 1226 or software embodying any one or more of the methodologies or functions described herein. The instructions 1226 can also reside, completely or at least partially, within the main memory 1204 or within the processing device 1202 during execution thereof by the machine 1200, the main memory 1204 and the processing device 1202 also constituting machine-readable storage media. The machine-readable storage medium 1224, the data storage system 1218, or the main memory 1204 can correspond to the memory device 110 of FIG. 1. In one implementation, the instructions 1226 include instructions 1211 contained in firmware to implement functionality corresponding to monitoring temperature of the memory device.

While the machine-readable storage medium 1224 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 1200 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 1200 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 1226 (e.g., software, programs, an operating system (OS), etc.) or other data are stored on the data storage device 1218 can be accessed by the main memory 1204 for use by the processing device 1202. The main memory 1204 (e.g., DRAM) is typically fast, but volatile, and thus a different type of storage than the data storage device 1218 (e.g., an SSD), which is suitable for long-term storage, including while in an "off" condition. The instructions 1226 or data in use by a user or the machine 1200 are typically loaded in the main memory 1204 for use by the processing device 1202. When the main memory 1204 is full, virtual space from the data storage device 1218 can be allocated to supplement the main memory 1204; however, because the data storage device 1218 device is typically slower than the main memory 1204, and write speeds are typically at least twice as slow as read speeds, use of virtual memory can greatly reduce user experience due to storage device latency (in contrast to the main memory 1204, e.g., DRAM). Further, use of the data storage device 1218 for virtual memory can greatly reduce the usable lifespan of the data storage device 1218.

In contrast to virtual memory, virtual memory compression (e.g., the Linux™ kernel feature "ZRAM") uses part of the memory as compressed block storage to avoid paging to the data storage device 1218. Paging takes place in the compressed block until it is necessary to write such data to the data storage device 1218. Virtual memory compression increases the usable size of the main memory 1204, while reducing wear on the data storage device 1218.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 1224 may further be transmitted or received over a network 1220 using a transmission medium via the network interface device 1208 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1208 may include one or more physical jacks (e.g., Ethernet, coaxial, or phone jacks) or one or more antennas to connect to the network 1220. In an example, the network interface device 1208 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1200, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, unless stated otherwise the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Example 1 includes subject matter (such as a memory device) comprising multiple memory dice arranged vertically in a stack of memory dice and at least one thermoelectric die. Each memory die of the multiple memory dice includes a bilk silicon layer and an active circuitry layer that includes memory cells of a memory array. The at least one thermoelectric die contacts the bulk silicon layer of at least one of the memory dice of the multiple memory dice, and the thermoelectric die is configured to one or both of reduce heat from the memory die when a current is applied to terminals of the thermoelectric die and generate a voltage at the terminals of the thermoelectric die when heat from the memory die is applied to the thermoelectric die.

In Example 2, the subject matter of Example 1, optionally includes a thermoelectric die that includes a thermoelectric generator configured to produce electrical energy using the heat from the at least one memory die, and an energy storage device operatively coupled to the thermoelectric generator and the at least one memory die. The energy storage device is configured to store electrical energy produced by the thermoelectric generator and provide electrical energy to the memory cells of the at least one memory die.

In Example 3, the subject matter of Example 2, optionally includes a thermoelectric generator that includes multiple alternating regions of p-type conductivity and n-type conductivity connected in series as a string of p-n regions, and wherein the heat from the at least one memory die produces electrical energy in the string of p-n regions.

In Example 4, the subject matter of one or any combination of Examples 1-3 optionally includes a thermoelectric die that includes a thermoelectric generator configured to produce electrical energy using heat from the at least one memory die, and the thermoelectric generator is operatively connected to provide the electrical energy to the memory cells of the at least one memory die.

In Example 5, the subject matter of Example 4 optionally includes a thermoelectric die that is wire bonded to the at least one memory die and the electrical energy is provided from the at least one thermoelectric die to the at least one memory die using a wire bond.

In Example 6, the subject matter of one or both of Example 4 and 5 optionally includes a thermoelectric die that is connected to the at least one memory die using a through silicon via (TSV), and the electrical energy is provided from the at least one thermoelectric die to the at least one memory die using the TSV.

In Example 7, the subject matter of one or any combination of Examples 4-6 optionally includes multiple thermoelectric dice arranged in multiple pairs with the multiple memory dice. A thermoelectric die of a pair contacts the bulk silicon of the memory die of the pair, and the multiple pairs are arranged vertically and laterally offset from an adjacent pair to form a staircase-stack of pairs.

In Example 8, the subject matter of one or any combination of Examples 1-7 optionally includes a heat sink coupled to the at least one thermoelectric die, and the thermoelectric die includes a peltier element configured to reduce heat of the at least one memory die when a current is applied to the peltier element.

In Example 9, the subject matter of Example 8 optionally includes at least one memory die that includes a temperature sensor configured to produce a temperature signal representative of temperature of the memory cells of the at least one memory die, and a controller configured to initiate applying the current to the peltier element according to the temperature signal.

In Example 10, the subject matter of Example 9 optionally includes a peltier element that includes multiple alternating regions of p-type conductivity and n-type conductivity connected in series as a string of p-n regions.

In Example 11, the subject matter of one or both of Examples 9 and 10 optionally includes at least one memory die that includes multiple memory dice arranged vertically in a stack having sidewalls, and the at least one thermoelectric die is arranged so that the peltier element contacts a stack sidewall.

In Example 12, the subject matter of one or any combination of Examples 9-11 optionally includes multiple thermoelectric dice arranged in multiple pairs with the multiple memory dice, and a thermoelectric die of a pair contacts the bulk silicon of the memory die of the pair. The multiple thermoelectric-memory die pairs are arranged vertically and laterally offset from an adjacent pair to form a staircase-stack of pairs with a portion of the thermoelectric die of the pair exposed to air. The peltier element of the thermoelectric die of the thermoelectric-memory die pair extends to the exposed portion of the thermoelectric die.

Example 13 includes subject matter (such as a method of operating a memory device) or can optionally be combined with one or any combination of Examples 1-12 to include such subject matter, comprising generating electrical energy from heat produced by a stack of multiple memory dice of the memory system using a thermoelectric generator included in a thermoelectric die contacting at least one memory die of the multiple memory dice, and providing the electrical energy from the thermoelectric die to memory cells included in the at least one memory die.

In Example 14, the subject matter of Example 13 optionally includes storing the generated electrical energy using an energy storage device included in the thermoelectric die and providing the stored electrical energy to the memory cells of the at least one memory die.

In Example 15, the subject matter of one or both of Examples 13 and 14 optionally includes generating the electrical energy from the heat produced by the memory die using multiple alternating regions of p-type conductivity and n-type conductivity connected in series as a string of p-n regions.

Example 16 includes subject matter (such as a memory system) or can optionally be combined with one or any combination of Examples 1-15 to include such subject matter, comprising multiple memory dice arranged in a stack of memory dice. Each memory die of the multiple memory dice includes an active circuitry layer that includes memory cells, a bulk silicon layer contacting the active layer on a first layer surface, and a peltier element formed on a second layer surface of the bulk silicon layer. The peltier element is configured to reduce heat of the memory die when a current is applied to the peltier element.

In Example 17, the subject matter of Example 16 optionally each memory die including a temperature sensor configured to produce a temperature signal representative of temperature of the memory cells of the memory die, and a controller configured to initiate applying the current to the peltier element according to the temperature sensor.

In Example 18, the subject matter of one or both of Examples 16 and 17 optionally includes a peltier element that includes multiple alternating regions of p-type conductivity and n-type conductivity connected in series as a string of p-n regions.

In Example 19, the subject matter of one or any combination of Examples 16-18 optionally includes the multiple memory dice arranged vertically with each memory die of the multiple memory dice laterally offset from an adjacent memory die with a portion of the memory die exposed to air, and a peltier element of each memory die that extends to the exposed portion of the memory die.

Example 20 includes subject matter (such as a method of operating a memory system) or can optionally be combined with one or any combination of Examples 1-19 to include such subject matter, comprising monitoring temperature of memory cells, included in at least one memory die of multiple memory dice arranged in a vertical stack of memory dice, using a temperature sensor included in the memory die, and applying current to a peltier element of a thermoelectric die contacting the at least one memory die according to the monitored temperature.

In Example 21, the subject matter of Example 20 optionally includes initiating the current applied to the peltier element using a controller of the at least one memory die.

In Example 22, the subject matter of one or both of Examples 20 and 21 optionally includes receiving a temperature signal representative of temperature of the memory array at control circuitry of the thermoelectric die and initiating the current applied to the peltier element using the control circuitry of the thermoelectric die.

In Example 23, the subject matter of one or any combination of Examples 20-22 optionally includes initiating applying current to the peltier element when the monitored temperature exceeds a first threshold temperature and ending applying the current to the peltier element when the monitored temperature is less than a second threshold temperature that is less than the first threshold temperature.

In Example 24, the subject matter of one or any combination of Examples 20-23 optionally includes applying the current to multiple alternating regions of p-type conductivity and n-type conductivity connected in series as a string of p-n regions.

These non-limiting Examples can be combined in any permutation or combination.

The invention claimed is:

1. A memory system comprising:
multiple memory dice arranged in a stack of memory dice, wherein at least one memory die of the multiple memory dice includes an active circuitry layer that includes memory cells and a bulk silicon layer contacting the active layer on a first layer surface;
at least one Peltier element configured to reduce heat of the at least one memory die when a current is applied to the at least one Peltier element;
a temperature sensor configured to produce a temperature signal representative of temperature of the memory cells of the memory die; and
wherein the at least one memory die includes current drive circuitry configured to apply current to the Peltier element when the temperature signal indicates that the temperature of the memory cells exceeds a first threshold temperature and stop the current to the Peltier element when the temperature signal indicates that the temperature is less than a second threshold temperature that is less than the first threshold temperature.

2. The memory system of claim 1, wherein the at least one Peltier element is formed on a second layer surface of the bulk silicon layer.

3. The memory system of claim 1, wherein the at least one Peltier element is included in a thermoelectric die contacting the at least one memory die.

4. The memory system of claim 3, wherein the thermoelectric die contacts more than one memory die of the multiple memory dice.

5. The memory system of claim 3, including a heat sink coupled to the at least one thermoelectric die.

6. The memory die of claim 1, wherein the bulk silicon layer has a sidewall surface and the peltier-Peltier element contacts the sidewall surface of the silicon of the bulk silicon layer.

7. The memory system of claim 1,
wherein the at least one Peltier element includes multiple Peltier elements with a Peltier element contacting each memory die of the multiple memory dice; and
wherein each memory die of the multiple memory dice includes:
a temperature sensor configured to produce a temperature signal representative of temperature of the memory cells of the memory die; and
a controller configured to initiate applying the current to the peltier-Peltier element according to the temperature signal.

8. The memory system of claim 1, wherein the Peltier element includes multiple alternating regions of p-type conductivity and n-type conductivity connected in series as a string of p-n regions.

9. The memory system of claim 8, including:
a heat sink; and
wherein the string of p-n regions is included in a thermoelectric die, the thermoelectric die is coupled to the heat sink by an electrically insulating layer and a layer of heat interfacing layer.

10. The memory system of claim 8, including:
wherein the regions of p-type conductivity and the regions of n-type conductivity are arranged on a second layer surface of the bulk silicon layer; and
wherein the regions of p-type conductivity are connected to the regions of n-type conductivity using an electric shunt to form the string of p-n regions on the second layer surface of the bulk silicon layer.

11. The memory system of claim 1, wherein the multiple memory dice are arranged vertically with each memory die of the multiple memory dice laterally offset from an adjacent memory die with a portion of the memory die exposed to air; and wherein the at least one Peltier element includes multiple Peltier elements with a peltier element contacting each memory die of the multiple memory dice, and the Peltier element of each memory die extends to the exposed portion of the memory die.

\* \* \* \* \*